(12) United States Patent
Chinnici et al.

(10) Patent No.: US 8,732,564 B2
(45) Date of Patent: May 20, 2014

(54) ERROR FLOOR REDUCTION IN ITERATIVELY DECODED FEC CODES

(75) Inventors: Stefano Chinnici, Milan (IT); Carmelo Decanis, Travaco'siccomario (IT)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 106 days.

(21) Appl. No.: 13/574,660

(22) PCT Filed: Jan. 27, 2010

(86) PCT No.: PCT/EP2010/050921
§ 371 (c)(1),
(2), (4) Date: Jul. 23, 2012

(87) PCT Pub. No.: WO2011/091845
PCT Pub. Date: Aug. 4, 2011

(65) Prior Publication Data
US 2012/0297267 A1    Nov. 22, 2012

(51) Int. Cl.
*H03M 13/00*    (2006.01)

(52) U.S. Cl.
USPC ........... 714/785; 714/780; 714/786; 714/752; 714/755; 714/774

(58) Field of Classification Search
USPC ............... 714/752, 755, 774, 780, 785–786
See application file for complete search history.

(56) References Cited

U.S. PATENT DOCUMENTS

| | | | |
|---|---|---|---|
| 7,243,287 B2 * | 7/2007 | Cameron et al. | 714/752 |
| 8,140,930 B1 * | 3/2012 | Maru | 714/752 |
| 8,347,191 B1 * | 1/2013 | Ran | 714/784 |
| 2008/0301517 A1 | 12/2008 | Zhong | |
| 2009/0307566 A1 | 12/2009 | No et al. | |

FOREIGN PATENT DOCUMENTS

EP    1655843 A1    5/2006

OTHER PUBLICATIONS

Adjudeanu, et al., "On the correlation between error weights and syndrome weights for belief propagation decoding of LDPC codes", Proc. 11th Canadian Workshop on Information Theory, May 13, 2009, pp. 36-41, XP031471458.
Garello, et al., "On Error Floor and Free Distance of Turbo Codes", IEEE, 2001, pp. 45-49.
Han, et al., "Low-Floor Decoders for LDPC Codes", IEEE Transactions on Communications, vol. 57 No. 6, Jun. 2009, pp. 1663-1673.
Han, et al., "LDPC Decoder Strategies for Achieving Low Error Floors", IEEE Xplore, Jul. 21, 2009, pp. 1-10, XP-002538104.
Takeshita, et al., "On the Frame-Error Rate of Concatenated Turbo Codes," IEEE Transaction on Communications, vol. 49 No. 4, Apr. 2001, pp. 602-308.
Wang, et al., "Finding All Small Error-Prone Substructures in LDPC Codes", IEEE Xplore, May 27, 2009, pp. 1976-1999.

* cited by examiner

*Primary Examiner* — Guy Lamarre
(74) *Attorney, Agent, or Firm* — Rothwell, Figg, Ernst & Manbeck, P.C.

(57) ABSTRACT

A method which makes use of the syndrome information at each iteration, combined with the bit reliability information available at a FEC decoder, to extract the minimum estimated bit error configuration, i.e. the block which is closest to the transmitted codeword during the decoding process, and to select such block if the result at the final decoding iteration has a higher number of estimated bit errors.

13 Claims, 7 Drawing Sheets

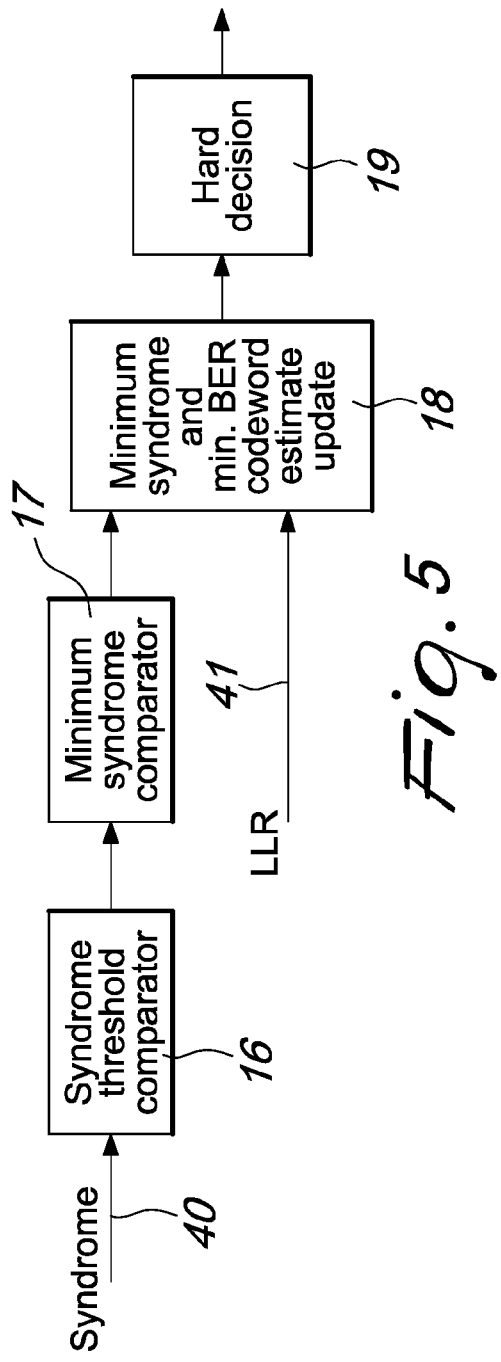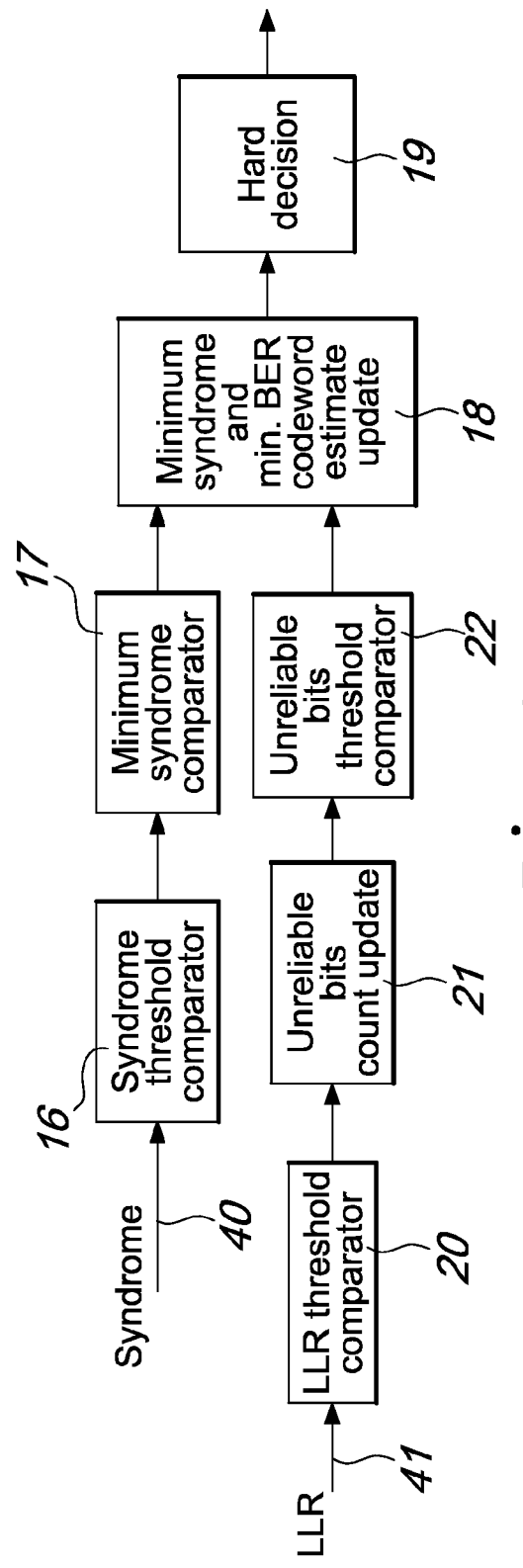

ERROR FLOOR REDUCTION IN ITERATIVELY DECODED FEC CODES

CROSS-REFERENCE TO RELATED APPLICATION

This application is a 35 U.S.C. §371 National Phase Entry Application from PCT/EP2010/050921, filed Jan. 27, 2010, and designating the United States, the disclosure of which is incorporated by reference herein.

TECHNICAL FIELD

The present invention relates to a method for reducing error floor in a communication system employing an iterative decoding of data encoded with a linear code. More particularly, the invention is adapted to wireless communication systems where channel coding, such as a Forward Error Correction coding, is used by transmitters to improve the quality of a wireless link.

BACKGROUND

Since the discovery of Shannon theorem the work on error coding has focused towards finding good codes which perform as close as possible to channel capacity and have a relatively simple encoder and decoder structure. The breakthrough discovery in the last decade of iteratively decoded Forward Error Correction codes has made possible the design of codes which approach channel capacity with limited hardware complexity. The class of iteratively-decoded capacity-approaching codes includes the so-called LDPC codes and turbo codes.

Well designed codes in this class closely approach channel capacity, with a very steep Bit Error Rate or Frame Error Rate curve versus the Signal-to-Noise Ratio (SNR). However, a change of slope in the BER (or FER) curve is often observed, leading to poorer performance at high SNR values. This phenomenon is the so called "error floor" onset.

Existing methods trying to minimize the error floor have focused either on code design techniques, or on decoder modifications and post processing of decoder output. Post processing is based on removal of weak code features which have been previously identified with semi-analytical methods on the code under analysis, decoder modifications often involve slowing the convergence of the decoder. An additional solution which is widely used is to add an outer algebraic code to remove the residual bit errors.

More complex decoder modifications address the problem by modifying the decoding algorithm to include, in the iterative decoding, a step for reinitializing the decoder with a more reliable error estimate.

Code design techniques are based on semi-analytical methods, which attempt to identify all weak structure in the code design phase. These results are either used to improve the code design or to post process the decoder output to remove weak structures. A drawback affecting this approach is that, from moderate block length, i.e. code block lengths exceeding few hundred bits, the exhaustive search of all weak structures is not feasible, and even heuristic algorithms which attempt to search for weak structures are ineffective above approximately 1000 bits. The result is that, for longer codes which are of practical interest, some of the weak structures in the code will not be noticed, resulting in an error floor in the high SNR/low BER region.

The known concatenation of an outer algebraic code to remove residual bit errors is an effective solution if and only if the dominant contribution to the high SNR BER (or FER) curve is due to error events with a low number of bits in error, where the term "low" means within the error correction capability of the outer code. It is important to note that the error correction capability of the outer code can be increased at the expense of an increased overhead.

This different approach will however fail in two cases: either when the FER curve is dominated by failed blocks with a high number of bit errors, or in the case when the FER curve is not dominated by these events, but the BER curve is, i.e. where a low number of blocks, decreasing with increasing SNR, is contributing with a large number of bits in error.

Methods involving decoder modifications which reinitialize the iterative decoding algorithm with a more reliable estimate, i.e. those obtained by using a soft-input soft-output iterative estimator, are on the contrary affected by convergence problem both in the estimator used and in the iterative decoding itself; these methods also present, as a further drawback, a great hardware complexity.

SUMMARY

It is an aim of the invention to obviate at least some of the above drawbacks and provide a method, a device and a radio link particularly suitable for reducing error floor in a communication system, leading to a more reliable estimate of the transmitted data on the receiver side of the communication system.

This aim and other objects which will become better apparent hereinafter are solved by a method for reducing error floor in a communication system that employs an iterative decoding of data encoded with a linear code. The method, at each decoding iteration, computes a current estimate of a transmitted data block. This computation is calculated at least from a previous iteration estimate or, if the decoding iteration is the first one, from a received data block to be decoded.

Then, from the current estimate of the transmitted data block, a syndrome information value and a received data reliability information value are determined.

Afterwards, there is a comparison of the syndrome information value with the minimum syndrome information value determined in all previous iterations and, if the syndrome information value is lower than the minimum syndrome information value, the syndrome information value previously determined is set as the minimum syndrome information value;

In the following step, a decoded codeword is determined based on a decision on the current estimate of the transmitted data block and from the received data reliability information value, and the decoded codeword is stored as the best estimate of the transmitted data block, if the syndrome information value is lower than the minimum syndrome information value.

The best estimate of the transmitted data block is output at the last decoding iteration, if convergence has not been reached by the iterative decoding, otherwise the decoded codeword determined at the decoding iteration where convergence has been reached is output.

As an alternative, at each decoding iteration different from the first one, the current estimate of the transmitted data block may be computed based not only on the previous iteration estimate, but on both the previous iteration estimate and the received data block to be decoded.

In preferred embodiments of the invention, the comparison of the syndrome information value with the minimum syndrome information value may be carried out only if the syndrome information value is lower than a syndrome threshold value.

Advantageously, the current estimate of the transmitted data block may be a block of bits and the received data reliability information value may be a log likelihood ratio for each bit of the block of bits. In this case, the log likelihood ratio for each bit may be compared with a reliability region for checking whether the bit is reliable and, if said checking fails, an unreliable bit count is increased; then, the determined syndrome information value may be set as the minimum syndrome information value, if the unreliable bit count is not higher than a predetermined cumulative reliability threshold.

The decision performed during the determination of a decoded codeword may be a hard decision on the log likelihood ratio for each bit of the block of bits.

Furthermore, the iterative decoding may be applied to a Forward Error Correction code, and may be a Low Density Parity Check iterative decoding, where the convergence is reached if all parity checks are satisfied, or a turbo code decoding, where the convergence is reached if a predetermined stopping rule is satisfied.

Moreover, in the preferred embodiments of the invention, the syndrome information value may be a syndrome weight.

The above aim and objects are also achieved by a receiver of a communication system, characterized in that it comprises a decoder which employs an iterative decoding algorithm for linear codes. The decoder is configured to compute at each iteration a current estimate of a transmitted data block at least from a previous iteration estimate or, if the iteration is the first one, from the received data block to be decoded. The decoder is also configured to determine, at each iteration, from the current estimate of the transmitted data block a syndrome information value and a received data reliability information value;

The receiver also comprises an error floor minimization device, which in its turn comprises means that perform a comparison at the current decoding iteration between the syndrome information value and the minimum syndrome information value determined in all previous decoding iterations of the iterative decoding algorithm.

The error floor minimization device further comprises means to set, at the current decoding iteration, the syndrome information value as the minimum syndrome information value, if the syndrome information value is lower than the minimum syndrome information value.

Other means which are present in the error floor minimization device are suitable to determine, at the current decoding iteration, a decoded codeword based on a decision on the received data reliability information value, and there are also means which store, at the current decoding iteration, the decoded codeword as the best estimate of the transmitted data block, if the syndrome information value is lower than the minimum syndrome information value, at the current decoding iteration.

Finally, the error floor minimization device comprises means which output either the best estimate of the transmitted data block at the last decoding iteration, if convergence has not been reached by the decoder, or the decoded codeword determined at the decoding iteration where convergence has been reached.

The decoder may be particularly configured to compute the current estimate of the transmitted data block not only from the previous iteration estimate, but from both the previous iteration estimate and the received data block to be decoded.

In preferred embodiments of the receiver, the means which compare the syndrome information value with the minimum syndrome information value may be adapted to carry out that comparison if the syndrome information value is lower than a syndrome threshold value.

Moreover, in the preferred embodiments of the invention, the current estimate of the transmitted data block may be a block of bits and the received data reliability information value may be a log likelihood ratio for each bit of the block of bits.

The error floor minimization device may furthermore comprise a log likelihood ratio threshold comparator that checks whether each bit of the block of bits is reliable based on a comparison between the log likelihood ratio for each bit of the block of bits and a reliability region; the log likelihood ratio threshold comparator may be connected to an unreliable bit counter which is adapted to increase an unreliable bit count for each bit of the block of bits determined to be unreliable by the log likelihood threshold comparator. The previously defined setting means may be connected to the log likelihood ratio threshold comparator and may be adapted to set the syndrome information value as the minimum syndrome information value if the unreliable bit count is not higher than a predetermined cumulative reliability threshold.

The decision on the received data reliability information value may be a hard decision on the log likelihood ratio for each bit of the block of bits.

Besides, the decoder may be an iterative Forward Error Correction decoder, and in particular may be a Low Density Parity Check decoder, where the convergence is reached if all parity checks are satisfied, or a turbo code decoder, where the convergence is reached if a predetermined stopping rule is satisfied.

In the preferred embodiments of the invention, the syndrome information value may be a syndrome weight.

Finally, the receiver may further include an antenna, that is adapted to receive a signal from a radio communication channel, and a demodulator which are cascaded upstream of the decoder.

The aim and the objects of the invention are further achieved by a radio link that comprises a transmitter and the previously disclosed receiver. In this radio link, the transmitter includes an encoder which encodes with a linear code data to be transmitted, a modulator of the data block encoded by the linear encoder and an antenna that transmits the modulated data encoded by the linear encoder over a radio communication channel.

The proposed method preferably addresses the case where the BER (or FER) curve at high SNR is dominated by a large number of bit errors concentrated in a low number of blocks. In general terms this situation is encountered both in LDPC codes and turbo codes. This method can be applied together with the concatenation of an outer algebraic code to get both a FER curve (thanks to code design and outer code use) and a BER curve free of the error floor phenomenon.

In practice, the invention is based on the observation that in iterative decoding of linear codes the syndrome of the code, at each decoding iteration, is highly correlated with the number of bit in errors, and that convergence of the decoder is not guaranteed to be monotonic. The proposed embodiments therefore make use of the syndrome information at each iteration, combined with the bit reliability information available at the decoder, to extract the minimum estimated bit error configuration, i.e. the block which is closest to the transmitted codeword during the decoding process, and to select such block if the result at the final decoding iteration has a higher number of estimated bit errors. In this way the BER contribution of error events which would have a high number of bits in error at the final decoding iteration can be reduced, resulting in an improvement of the BER curve which is most relevant at high SNR.

BRIEF DESCRIPTION OF THE DRAWINGS

Further characteristics and advantages of the invention will become better apparent from the detailed description of particular but not exclusive embodiments, illustrated by way of non-limiting examples in the accompanying drawings, wherein:

FIG. 5 shows in detail the error floor minimization device according to a first embodiment of the invention;

FIG. 6 shows in detail the error floor minimization device according to a second embodiment of the invention;

DETAILED DESCRIPTION

In the following we will consider, for the sake of simplicity, binary codes, however the method disclosed is applicable also to non-binary codes.

Figure 1:
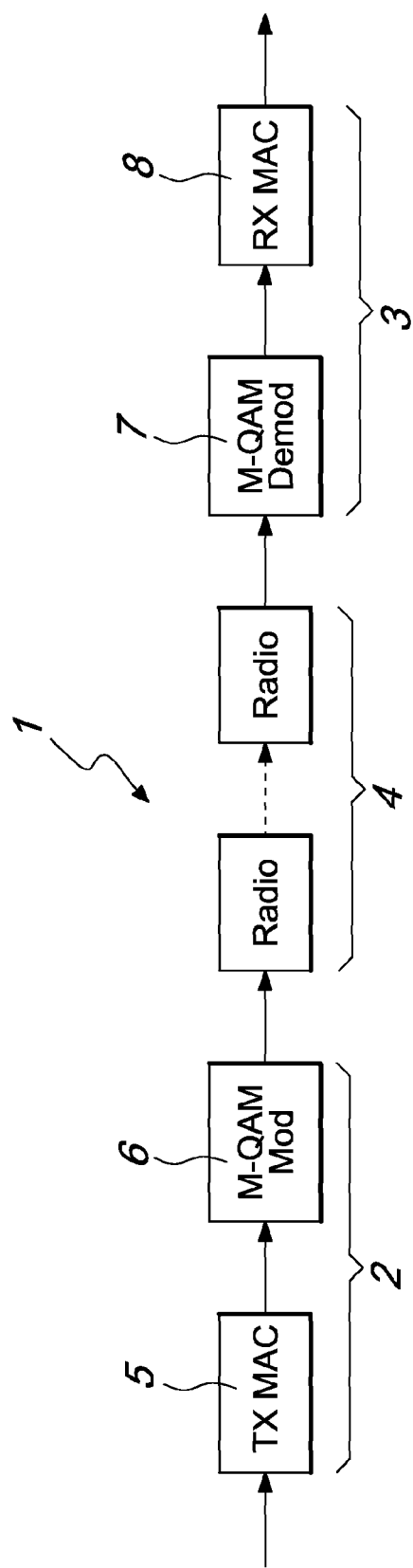
FIG. 1 shows a radio link which uses an iteratively decoded linear code to transmit data over a radio communication channel.

FIG. 1 shows a radio link 1 according to the preferred embodiments of the invention and which uses an iteratively decoded linear code as a channel code. A signal flows from a transmitter 2 to a receiver 3 via a radio communication channel 4. In particular, the transmitter 2 employs a Tx Media Access Control (MAC) 5 and a modulator 6, such as an M-point Quadrature Amplitude Modulation (M-QAM) modulator, and correspondingly the receiver 3 employs a M-QAM demodulator 7 for demodulating the transmitted modulated signal, and a Rx Media Access Control 8.

Figure 2:
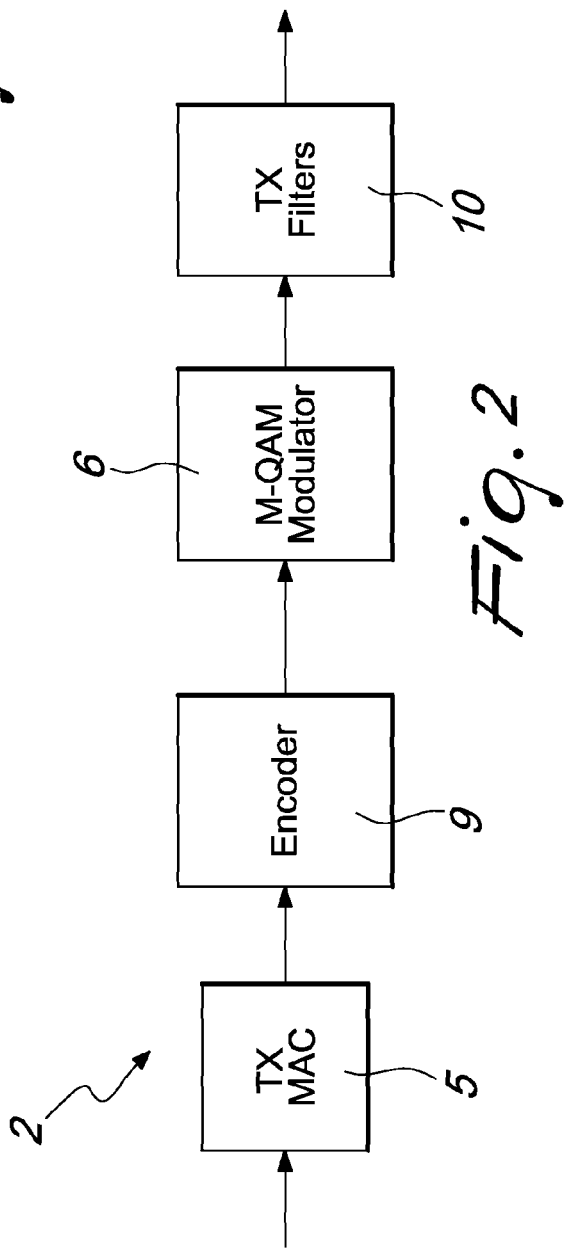
FIG. 2 depicts the transmitter device comprised in the radio link.

FIG. 2 discloses with more detail all the components which are comprised in the transmitter 2 of the radio link 1. The Tx MAC 5 receives raw data bits from a source of information and schedules the bits for transmission, with a data rate which may be increased or decreased depending on the selected modulation level M. The bitstream from the Tx MAC 5 is encoded in a linear encoder 9, which is preferably a Forward Error Correction (FEC) encoder. The FEC encoded bitstream is mapped in the M-QAM modulator 6 according to the modulation mode in use, which is based on the number M of points defining the QAM constellation. Before radio transmission, a TX filter section 10 is used for processing and preparing for radio transmission the symbols from the M-QAM modulator 6.

Figure 3:
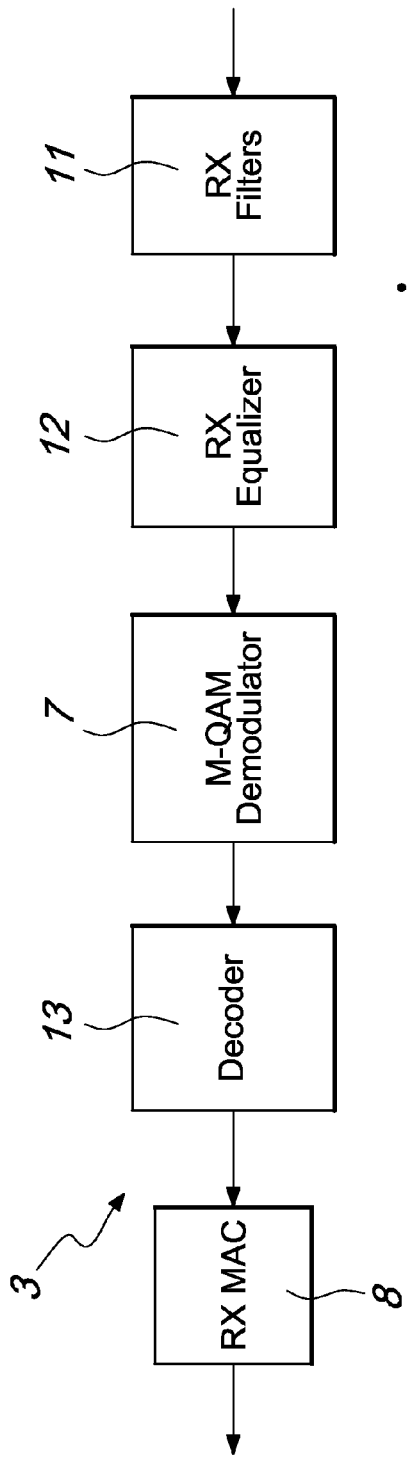
FIG. 3 illustrates the receiver device comprised in the radio link.

FIG. 3 discloses with more detail all the components which are comprised in the receiver 3 of the radio link 1. A Rx filter section 11 performs a first filtering operation on the received signal, a Rx adaptive equalizer 12 restores the signal quality by removing the residual inter-symbol interference, and the M-QAM demodulator 7 demaps the received symbols. Downstream of the M-QAM demodulator 7, a decoder 13 employing an iterative decoding algorithm for linear codes applies suitable error correction to the demapped bitstream using soft information. Finally, the Rx MAC 8 repacks the variable rate data stream.

Figure 4:
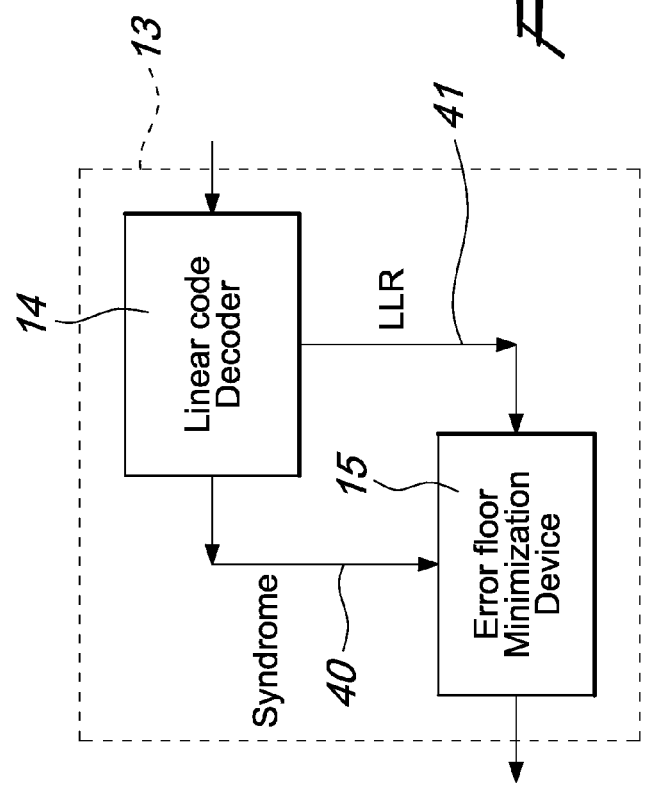
FIG. 4 shows the linear code decoder and the error floor minimization device which are comprised in the receiver.

As shown in FIG. 4, the decoder 13 comprises by a linear code decoder 14, such as a FEC decoder, adapted to receive a data block encoded with a linear code and to generate, at each iteration of the decoding process, a syndrome information value 40 and a received data reliability information value 41 for an error floor minimization device 15.

The syndrome information value 40 is preferably a syndrome weight, namely the number of non-null symbols (e.g. bits) in the vector that results from the multiplication of the received data block or the estimate of the transmitted block at current decoding iteration times the parity-check matrix. The syndrome information value indicates the degree of disturbance that is present in the communication channel where the signal flows, indeed a value of the syndrome which is not null indicates that there is no correspondence between the transmitted and received data blocks, while on the contrary a value of the syndrome which is null indicates that the received data block is identical with the transmitted one, and so an absence of any kind of disturbance or noise in the communication channel.

Together with the syndrome information value, the linear code decoder 14 outputs at each iteration the received data reliability information value 41, which is preferably a log-likelihood ratio (LLR) value for each bit of the data block being decoded. The received data reliability information value 41 represents the probability that each bit (or, more generally, symbol) estimated by the linear code decoder 14 has been correctly decoded.

In the preferred embodiments of the invention, syndrome weight 40 and log-likelihood ratio 41 are input to an error floor minimization device 15, which is still comprised in the decoder 13, whose operation will be disclosed with more detail hereinafter.

The linear code in which the data block is encoded may be a Low Density Parity Check (LDPC) code or a turbo code. The linear code decoder 14 can apply any iterative decoding algorithm, either soft decision or hard decision based. In the embodiments described hereinafter, soft-decision LLRs and the iterative belief propagation algorithm are used.

FIG. 5 represents the detailed logic structure of the error floor minimization device 15, according to a first embodiment of the invention using an LDPC decoder. Such logic structure can be reproduced in hardware by suitably programming a processor, such as a Digital Signal Processor.

The syndrome weight 40 resulting from the current iteration i (where i is an integer) is preferably input to a syndrome threshold comparator 16, in order to be compared with a predetermined syndrome threshold value, which is preferably set to be so high as to make the decoding operation fail at the first decoding iteration (i=0). A minimum syndrome comparator 17 is also provided downstream of the syndrome threshold comparator 16 and is adapted to further compare, when lower than the syndrome threshold value, the current syndrome weight 40 with the minimum syndrome value derived from all of the previous iterations. The minimum syndrome comparator 17 is connected upstream of a setting means 18, for updating the minimum syndrome value according to the result of this second comparison at the minimum syndrome comparator 17. The setting means 18 also receives in input the LLR soft bits 41 and is suitable to update an estimate with minimum BER of the transmitted codeword based on the LLR soft bits 41.

Setting means 18 are in turn connected to a decision block 19 which outputs either the best estimate of the transmitted codeword or a codeword which identically corresponds to the transmitted codeword, according to a method whose steps will be described more in detail later.

FIG. 6 depicts the logic structure of the error floor minimization device according to a second embodiment of the invention, wherein the same reference numbers have been used for the same elements shown in FIG. 5. The logic structure of FIG. 6 can be reproduced in hardware by suitably programming a processor, such as a Digital Signal Processor.

The error floor minimization device according to the second embodiment comprises the same threshold comparator 16, minimum syndrome comparator 17, setting means 18 and hard decision block 19 of the first embodiment. The difference with respect to the first embodiment is that the LLR soft bits 41 are subject to checks before being fed to the setting means 18. In particular, a LLR threshold comparator 20 is provided, which, at each decoding iteration i, performs a comparison of the LLR soft bits 41 with a reliability threshold, which corresponds to a predefined probability region; an unreliable bit counter 21 connected to the LLR threshold comparator 20 performs an increase of an unreliable bit count if the LLR for a bit falls within the predefined probability region. The unreliable bit counter 21 is connected to an unreliable bit threshold comparator 22 which decides, according to a fixed cumulative reliability threshold value, if the unreliable bits counted by the unreliable bit counter 21 exceed or not said threshold.

The threshold comparator 22 is connected to the setting means 18, which are then joined to the decision block 19 as in the previous figure.

A method of operation according to the first embodiment of the invention is now described with reference to FIG. 7.

The linear code decoder 14 receives binary data encoded with a linear code, which has been demapped from the M-QAM demodulator 7 after having being suitably filtered and equalized by the blocks 11 and 12 shown in FIG. 3. The encoded data blocks which are input to the linear code decoder 14 derive from corresponding data blocks that have been generated and input to the encoder 9 at the remote transmitter 2.

In the first embodiment of the invention, the linear code is an LDPC code and the linear code decoder 14 uses an iterative belief propagation algorithm having a predetermined number of iterations. The algorithm converges when all parity checks equations are satisfied and, accordingly, when it is found an estimate corresponding to the transmitted data block, i.e. the data block that was fed to the encoder 9. Otherwise, the algorithm stops when the last iteration of the predetermined number of iterations has been performed.

At each decoding iteration i (i=0, 1, 2, . . . ), the linear code decoder 14 computes at step 70 a current estimate of the transmitted data block, calculating this estimate at least from a previous iteration estimate i−1 and, optionally, also from the received data block to be decoded. Only if the iteration is the first one (i=0), the estimate is calculated directly from the received data block to be decoded. Hereinafter, each of the following method steps are intended to be performed at a generic decoding iteration i, unless otherwise specified.

At step 71, the syndrome information value 40 and the received data reliability information value 41 are determined from the current estimate of the transmitted data block and they are fed from the linear code decoder 14 to the error floor reduction device 15. Preferably, the syndrome information value 40 and the received data reliability information value 41 respectively correspond to the syndrome weight and to the soft decision LLR for each bit of the current estimate of the transmitted data block.

At the optional step 72 the syndrome weight 40 is compared with the syndrome threshold value at the syndrome threshold comparator 16.

If the syndrome weight 40 is not lower than the syndrome threshold value, the method stops and a new decoding iteration (i+1) starts, which leads to the computing of a new estimate of the transmitted data block at step 70.

If the syndrome weight 40 is lower than the syndrome threshold value and the iteration is the first one (i=0), the procedure jumps to step 74, where the current syndrome weight 40 is set as the minimum syndrome value.

Otherwise, if the iteration is not the first one (i>0), the syndrome weight 40 is further compared at step 73 with the minimum syndrome weight stored in the error floor minimization device, i.e. the value determined at the previous iterations (i−1, i−2, . . . , 0).

If the current value of the syndrome weight 40 is determined at step 73 to be not lower than the minimum syndrome weight found in the previous iterations, the previously set minimum syndrome weight is not updated and the iteration restarts from the next decoding iteration (i+1).

Otherwise, if the current value of the syndrome weight 40 is lower than the minimum syndrome weight found in the previous iterations, at step 74 the current value of the syndrome weight 40 is set as the new minimum syndrome value and it is stored.

Figure 8:
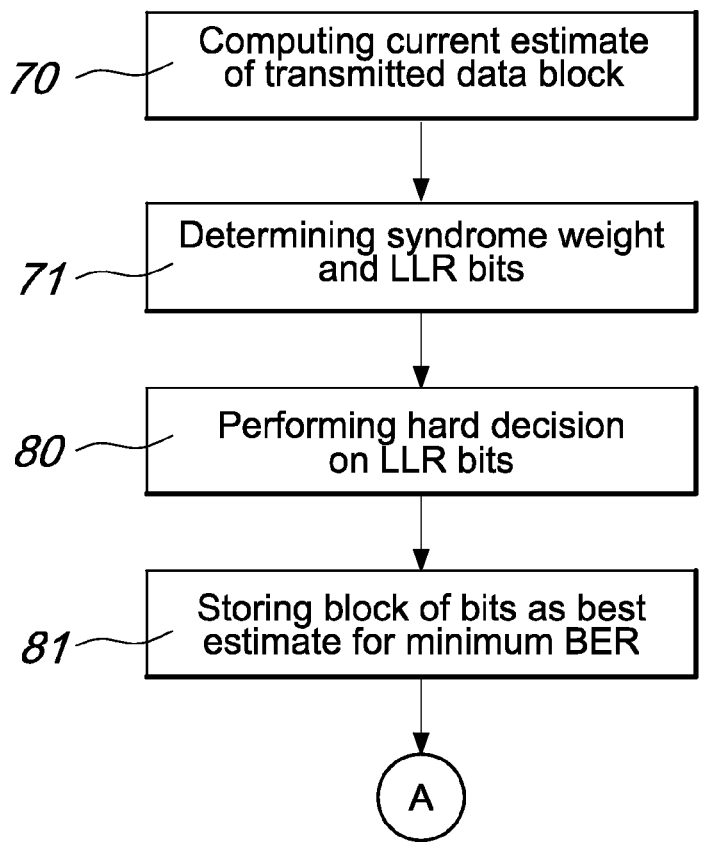

A further elaboration on the LLR soft bits is performed in parallel to the above syndrome evaluation steps, as shown in FIG. 8.

The first two steps 70 and 71 are shown in FIG. 8 for the sake of clarity, and they correspond to the same steps 70 and 71 described herein above. At step 80, hard decision on LLR soft bits 41 is performed. In this way, a FEC block of bits is obtained, which is stored at step 81 by the setting means 18 as the current best estimate of the transmitted data block, i.e. corresponding to a minimum BER configuration.

Figure 7:
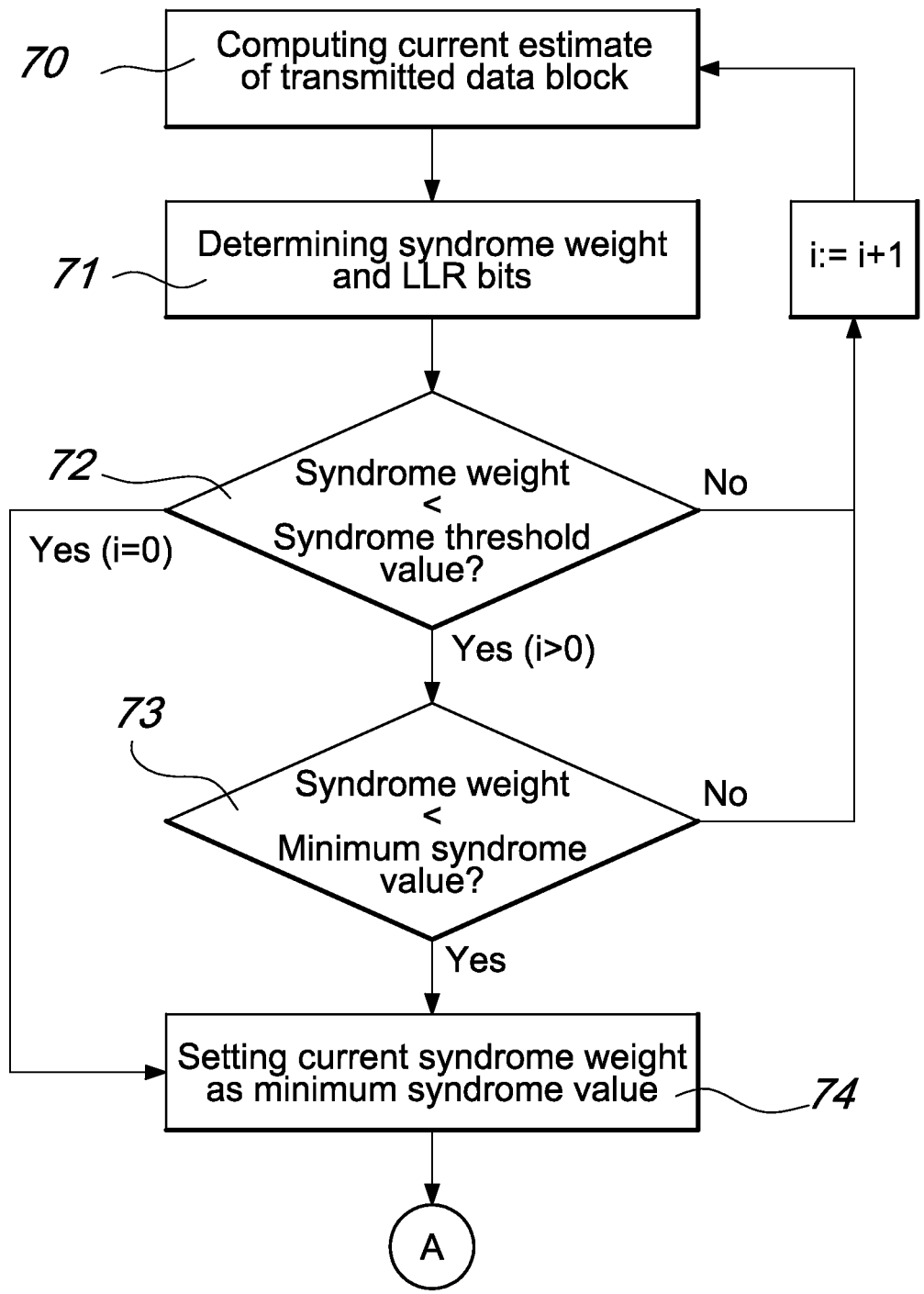
FIGS. 7 to 9 represent flow diagram showing a method according to a the first embodiment of the present invention.
Figure 9:
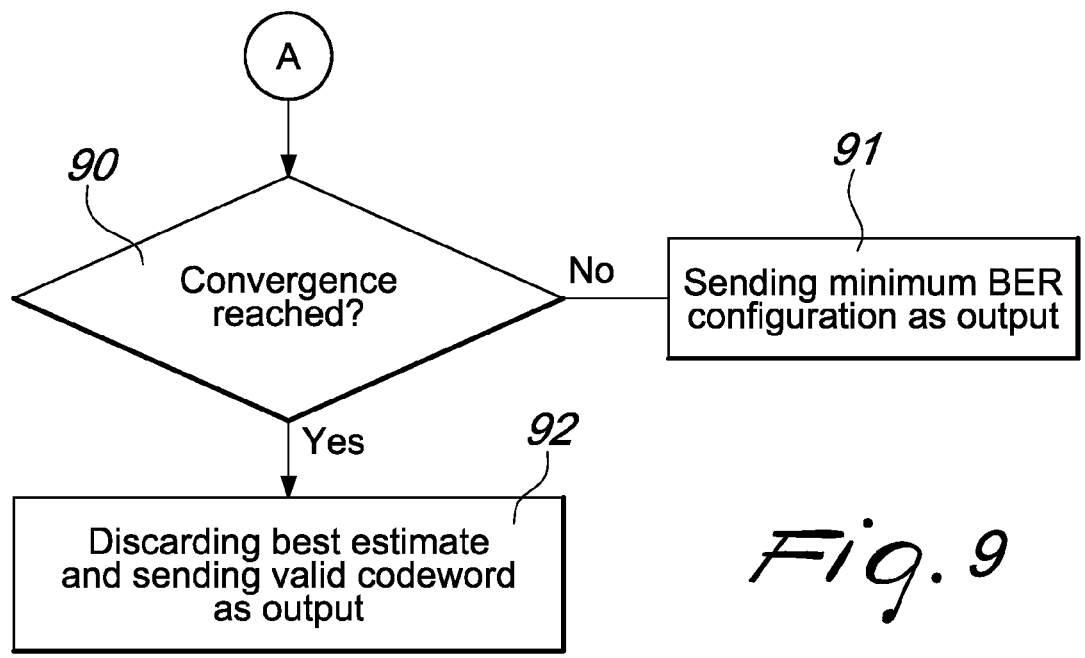

The parallel elaboration processes shown in FIGS. 7 and 8 converge to the decision block 90 of FIG. 9. In particular, at step 90 it is verified whether, at the current decoding iteration i, convergence has been reached, that is to say if the minimum syndrome value stored in step 74 is zero. If so, at step 92 the best estimate of the transmitted data block previously stored at step 81 is discarded and the valid decoded codeword with the null syndrome is output from the error floor minimization device 15. Otherwise, if the method does not come up to a null value of the syndrome, the codeword corresponding to the minimum BER configuration estimate stored at step 91 is output.

Figure 11:
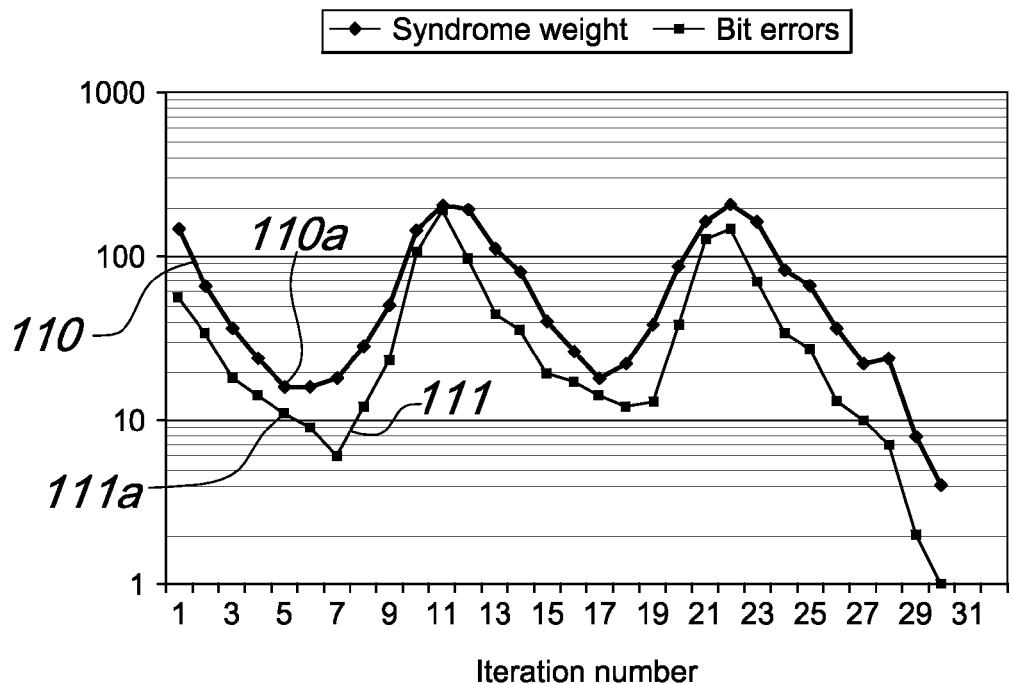
FIG. 11 is a plot showing the correlation between the syndrome value and the bit errors at the decoder at different LDPC iteration steps.

With reference to FIG. 11, which shows the correlated behavior of the syndrome weight curve 110 with respect to the bit error numbers curve 111, it is noted that thirty iterations would be necessary for achieving a low number of bit errors. In practice, a decoding with such a high number of iterations would not feasible because of the high demand in terms of latency, calculation load and power dissipation. With a more realistic number of iterations, such as ten, the first embodiment of the invention would result in the decoder 13 outputting the codeword estimated at the fifth iteration, where the syndrome weight curve reaches a minimum 110a and a relatively low number of bit errors 111a. In prior art LDPC decoders, instead, the codeword at the last iteration would be output, which would have a greater number of bit errors and a large syndrome weight.

The first embodiment which has been just described has a low complexity, but may be improved in terms accuracy in the reliability of the estimation of the minimum BER configuration.

In order to have a yet more precise decoding algorithm, the second embodiment of the invention, depicted in FIG. 6, is used. The second embodiment has an increased complexity due to the need to process the LLR values at each iteration, but offers an advantage in terms of reliable estimate of the minimum BER configuration.

Figure 10:
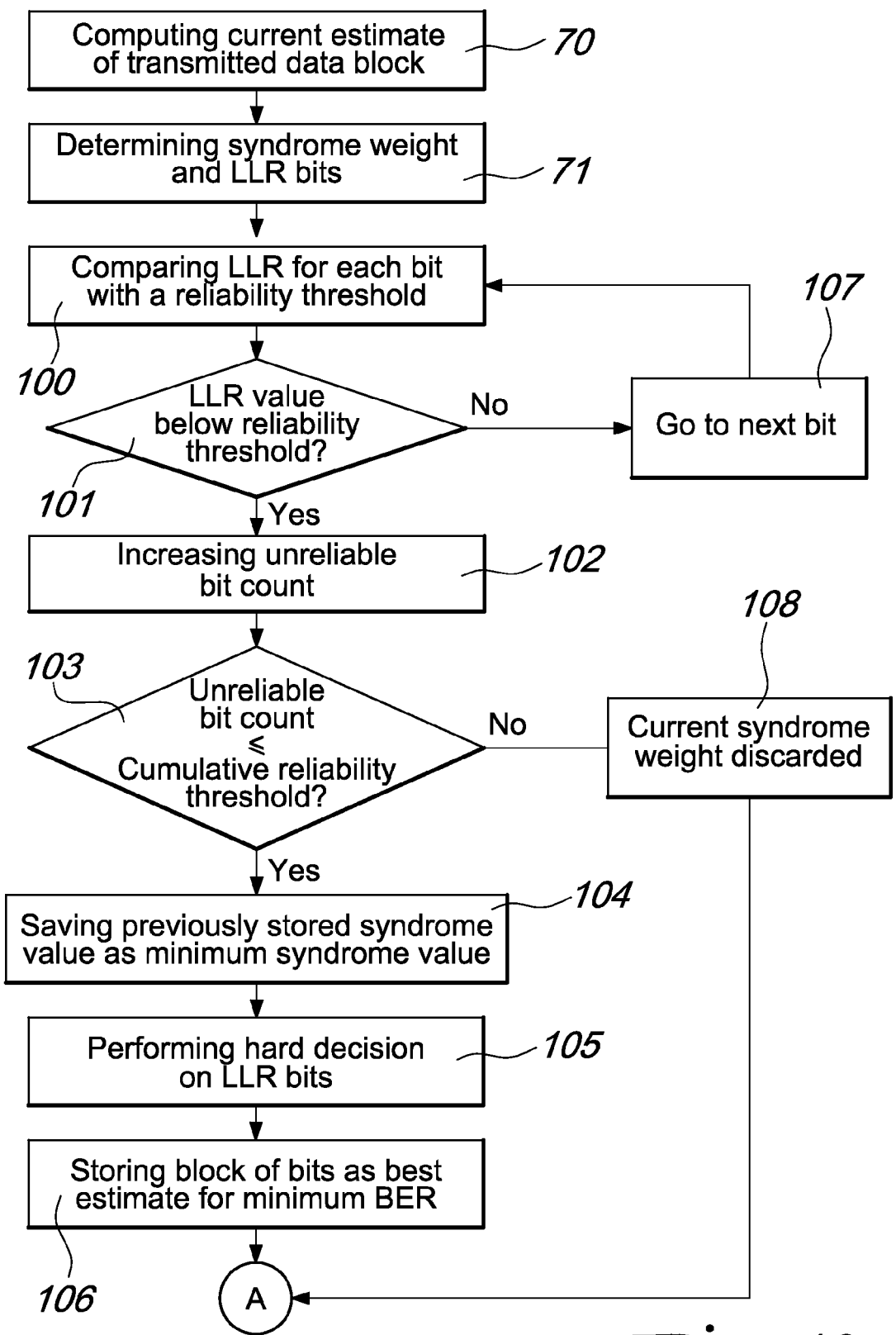
FIG. 10 is a flow diagram representing a method according to the second embodiment of the invention.

The operation of the second preferred embodiment of the invention is shown in FIG. 10, which replaces the steps shown FIG. 8 and combines with the method of FIG. 7. Again, reference is made to a current iteration i of a predetermined number of iterations set in the LDPC decoding algorithm.

The first two steps 70 and 71 are the same of the first embodiment and, as a consequence, they provide a syndrome weight 40 and LLR soft bits 41. Then, in step 100 the LLR threshold comparator 20 receives such LLR soft bits for performing a comparison between the corresponding LLR value and the predetermined reliability threshold.

At step 101, it is accordingly verified whether the LLR value for each bit is to be considered as an unreliable estimation of the corresponding transmitted bit.

If not so, at step 107 the unreliable bit count is left unchanged, and processing returns to step 100, where the next bit is compared with the reliability threshold.

Otherwise, if the LLR value for each bit is to be considered as an unreliable estimation of the corresponding transmitted bit, at step 102 an unreliable bit count is increased by one, at the unreliable bit counter 21, and is then compared at step 103 with the cumulative reliability threshold value stored in the unreliable bits threshold comparator 22. The evaluation at steps 101 and 102 is repeated until the LLR values of all the bits of current estimate of the transmitted data block have been evaluated.

If the unreliable bit count does not exceed the cumulative reliability threshold, at step 104 the syndrome weight previously stored in step 74 is definitely stored as the minimum syndrome value. Then, at step 105 a hard decision is performed on the LLR soft bits and at step 106 the FEC block of bits obtained through the hard decision is stored as the current best estimate of the transmitted data block, corresponding to a minimum BER configuration. On the contrary, if the cumulative reliability threshold is exceeded, at step 108 the current syndrome weight 40 is not considered and the previously stored minimum syndrome value is kept, steps 104 to 106 are not executed and the procedure jumps to step 90 and continues as in the first embodiment.

The two embodiments described above regard transmitted data encoded with LDPC codes, where the decoder knows with certainty when a valid codeword is obtained by the algorithm, i.e. when the convergence is reached.

Figure 12:
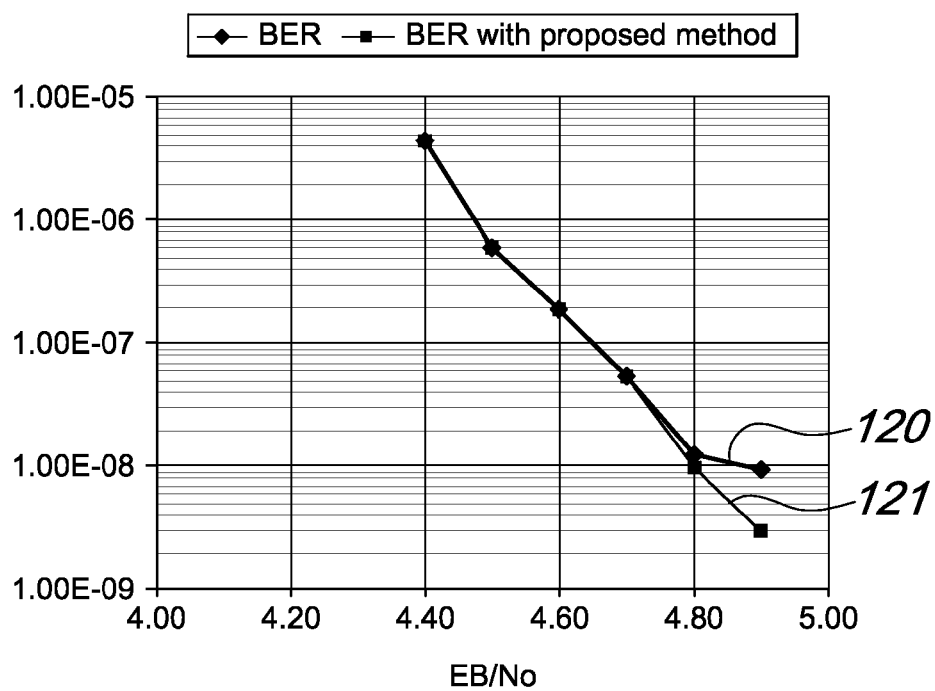
FIG. 12 illustrates a comparison of the Bit Error Ratio curve at high Energy-per-bit-to-Noise ratio with and without the proposed method for error floor reduction.

FIG. 12 illustrates in an exemplary diagram comparing a BER curve at high Energy-per-bit-to-Noise ratios (Eb/No) with and without the proposed method for error floor reduction for an LDPC code. Curve 120 shows a typical error floor at high Eb/No values, i.e. a trend which is not monotonic at high SNR values. By using the method according to the invention, instead, the curve 121 remains at high Eb/No values as steep as at lower Eb/No values.

Additional embodiments of the invention can use turbo codes instead of LDPC codes, without altering the logic structure of the decoder depicted in FIGS. 4 to 6. Differently from the first and second embodiments, when a binary turbo code based on either parallel or serial concatenation of binary convolutional codes is used, the decoder is configured to employ a predetermined stopping rule to declare convergence and comprises a syndrome former which is used to compute the code syndrome at each iteration in a similar way as it is described before for the LDPC code. The syndrome former works on the estimate of hard decision bits which is extracted from the decoder at each iteration.

The above embodiments using a turbo code instead of an LDPC code operate as shown in FIGS. 7 to 10, with the only difference being that convergence is not derived from previous elaborations but only from the predetermined stopping rule. Thus, at step 92, it is more correct to refer to the finding, rather than of a valid codeword, of a reliable codeword according to the specific stopping metric used in the turbo decoder.

More in detail, in a third embodiment of the invention, at each iteration, the syndrome value determined by the syndrome former is compared with a syndrome threshold value. If the syndrome value is lower than the threshold, it is compared with the minimum syndrome value of the syndrome found in the previous iterations. If the current value of the syndrome value is lower than the minimum syndrome value, the current syndrome value is stored. At the same time, hard decision is performed on the LLR soft bits and the FEC block bits thus obtained are stored as the current best estimate of the minimum BER configuration.

If in the decoding process a reliable codeword according to the stopping metric used in the turbo decoder is found, the best estimate of the minimum BER configuration is discarded and the reliable codeword is output. If, at the end of the decoding iterations, a reliable codeword is not found, the best estimate of the minimum BER configuration is output.

The third embodiment which has been just described has a low complexity, but may be improved in terms accuracy in the reliability of the estimation of the minimum BER configuration.

In order to have a yet more precise decoding algorithm, a fourth embodiment of the invention can be provided, which has an increased complexity due to the need to process the LLR values at each iteration, but offers an advantage in terms of reliable estimate of the minimum BER configuration.

In the fourth embodiment of the invention, at each iteration the syndrome value determined by the syndrome former is compared with the syndrome threshold value. If lower than the syndrome threshold value, the syndrome value is compared with the minimum value of the syndrome found in the previous iterations. If the current syndrome value is lower than the previous minimum value, the new value is stored.

The LLR for each bit in the FEC block being decoded is compared with a reliability threshold. If the LLR value for a bit is within a predefined unreliable region, an unreliable bit count is updated. The final unreliable bit count is then compared with a cumulative reliability threshold. If the cumulative reliability threshold is not exceeded, the previously stored syndrome value is saved as minimum syndrome value, hard decision is performed on the LLR soft bits and the FEC block bits thus obtained are stored as the current best estimate of the minimum BER configuration.

If in the decoding process a reliable codeword according to the stopping metric used in the turbo decoder is found, the best estimate of the minimum BER configuration is discarded and the reliable codeword is output. If at the end of the decoding iterations a reliable codeword is not found, the best estimate of the minimum BER configuration is output.

It must be noted that the invention is can be carried out also when the FEC scheme discussed in all of the above embodiments is replaced with a concatenated FEC scheme by adding an algebraic outer code.

Further embodiments of the invention can include some refinements in the processing of LLR at each iteration. For instance the LLR threshold comparator 20, the blocks 21 and 22 of FIG. 6 and the corresponding elaboration steps shown in FIG. 10 can be replaced by an average of the bit reliabilities followed by a threshold comparison. Another possibility is to compare the worse value of the bit reliabilities with a threshold.

It has been shown that the invention achieves the intended aim and objects, since it gives the possibility to reduce, in a radio link where data are transmitted with linear encoding, the Bit Error Ratio at the receiver side, when an iterative Forward Error Correction decoding is applied.

With respect to prior art, the invention has several advantages: first of all the method is applicable to linear codes irrespective of the code block length, while semi-analytical techniques are not, and to any linear code which can be iteratively decoded. Besides, the invention is not limited to binary linear codes and exploits the information content which is readily available with little added complexity in the iterative decoding algorithms.

Moreover, the method can be combined with proper code design techniques aimed at minimizing the Frame Error Rate and with the well established technique of concatenating an outer algebraic code to remove residual bit errors and improve BER and FER.

Clearly, several modifications will be apparent to and can be readily made by the skilled in the art without departing from the scope of the present invention. Therefore, the scope of the claims shall not be limited by the illustrations or the preferred embodiments given in the description in the form of examples, but rather the claims shall encompass all of the features of patentable novelty that reside in the present invention, including all the features that would be treated as equivalents by the skilled in the art.

Where technical features mentioned in any claim are followed by reference signs, those reference signs have been included for the sole purpose of increasing the intelligibility of the claims and accordingly, such reference signs do not have any limiting effect on the interpretation of each element identified by way of example by such reference signs.

The invention claimed is:

1. A method for reducing error floor in a communication system employing an iterative decoding of data encoded with a linear code, the method comprising, at each decoding iteration and for a predetermined number of iterations:
   a) computing a current estimate of a transmitted data block, said computing being calculated at least from a previous iteration estimate or, if at first iteration, from a received data block to be decoded;
   b) determining from said current estimate of the transmitted data block a syndrome weight and a received data reliability information value, wherein said current estimate of the transmitted data block is a block of bits and said received data reliability information value is a log likelihood ratio for each bit of said block of bits;
   c) comparing said syndrome weight with the minimum syndrome weight determined in all previous iterations and, if said syndrome weight is lower than said minimum syndrome weight, setting said syndrome weight as temporary minimum syndrome weight;
   d) comparing the log likelihood ratio for each bit with a reliability region for checking whether said bit is reliable and, if said checking fails, increasing an unreliable bit count;
   e) setting said temporary minimum syndrome weight determined in step c) as the minimum syndrome weight if the unreliable bit count is not higher than a predetermined cumulative reliability threshold;
   f) determining a decoded codeword based on a decision on said current estimate of the transmitted data block and from said received data reliability information value; and
   g) storing said decoded codeword obtained in step f) as the best estimate of the transmitted data block if in step e) said minimum syndrome weight is set;
   wherein said best estimate of the transmitted data block is output at the last decoding iteration, if convergence has not been reached by the iterative decoding, otherwise the decoded codeword determined at the decoding iteration where convergence has been reached is output.

2. The method of claim 1, wherein the current estimate of the transmitted data block is computed from both the previous iteration estimate and the received data block to be decoded.

3. The method of claim 1, wherein said step of comparing said syndrome weight with the minimum syndrome weight is carried out only if said syndrome weight is lower than a syndrome threshold value.

4. The method of claim 1, wherein the decision in step e) is a hard decision on said log likelihood ratio for each bit of said block of bits.

5. The method of claim 1, wherein said iterative decoding is applied to a Forward Error Correction code.

6. The method of claim 1, wherein said iterative decoding is a Low Density Parity Check iterative decoding, said convergence being reached if all parity checks are satisfied.

7. A receiver of a communication system, the receiver comprising:
   a decoder employing an iterative decoding algorithm for linear codes, said decoder being configured to compute at each iteration and for a predetermined number of iterations a current estimate of a transmitted data block at least from a previous iteration estimate or, if at first iteration, from the received data block to be decoded; said decoder being also configured to determine at each iteration from said current estimate of the transmitted data block a syndrome weight and a received data reliability information value, wherein said current estimate of the transmitted data block is a block of bits and said received data reliability information value is a log likelihood ratio for each bit of said block of bits; and
   an error floor minimization device comprising:
   a minimum syndrome comparator for comparing at a current decoding iteration said syndrome weight with the minimum syndrome weight determined in all previous decoding iterations of the iterative decoding algorithm;
   an estimate updater for setting at the current decoding iteration said syndrome weight as temporary minimum syndrome information value if said syndrome weight is lower than said minimum syndrome weight;
   a log likelihood ratio threshold comparator for checking whether each bit of said block of bits is reliable based on a comparison between the log likelihood ratio for each bit of said block of bits and a reliability region, said log likelihood ratio threshold comparator being connected to an unreliable bit counter which is adapted to increase an unreliable bit count for each bit of said block of bits determined to be unreliable by said log likelihood threshold comparator, said means for setting being connected to said log likelihood ratio threshold comparator and being adapted to set said temporary minimum syndrome weight as the minimum syndrome weight if the unreliable bit count is not higher than a predetermined cumulative reliability threshold; and a decision block for determining at the current decoding iteration a decoded codeword based on a decision on said received data reliability information value, wherein the estimate updater is configured to store at the current decoding iteration said decoded codeword as the best estimate of the transmitted data block if said temporary syndrome weight is set as said minimum syndrome weight at the current decoding iteration when the unreliable bit count is not higher than a predetermined cumulative reliability threshold, and wherein the error floor minimization device is operable to output either said best estimate of the transmitted data block at the last decoding iteration, if convergence has not been reached by the iterative decoder, or the decoded codeword determined at the decoding iteration where convergence has been reached.

8. The receiver of claim 7, wherein said decoder is configured to compute the current estimate of the transmitted data block from both the previous iteration estimate and the received data block to be decoded.

9. The receiver of claim 7, wherein the decision is a hard decision on said log likelihood ratio for each bit of said block of bits.

10. The receiver of claim 7, wherein said decoder is an iterative Forward Error Correction decoder.

11. The receiver of claim 10, wherein said decoder is a Low Density Parity Check decoder, said convergence being reached if all parity checks are satisfied.

12. The receiver of claim 7, further including a receiving antenna for receiving a signal from a radio communication channel and a demodulator which are cascaded upstream of said decoder.

13. A radio link comprising a transmitter and the receiver of claim 12, said transmitter including an encoder for encoding with a linear code data to be transmitted, a modulator of the data block encoded by the linear encoder and a transmitting antenna for transmitting the modulated data encoded by the linear encoder over a radio communication channel.

* * * * *